(12) United States Patent
Fukushi et al.

(10) Patent No.: US 7,620,079 B2
(45) Date of Patent: Nov. 17, 2009

(54) WAVELENGTH CONVERTER APPARATUS

(75) Inventors: Ichiro Fukushi, Sagamihara (JP); Koji Tojo, Sagamihara (JP); Kazuma Watanabe, Hadano (JP)

(73) Assignee: Shimadzu Corporation, Kyoto (JP)

( * ) Notice: Subject to any disclaimer, the term of this patent is extended or adjusted under 35 U.S.C. 154(b) by 73 days.

(21) Appl. No.: 12/150,714

(22) Filed: Apr. 30, 2008

(65) Prior Publication Data

US 2009/0196320 A1    Aug. 6, 2009

(30) Foreign Application Priority Data

Jan. 31, 2008    (JP)    ............................. 2008-020014

(51) Int. Cl.
*H01S 3/10*    (2006.01)
(52) U.S. Cl. .......................................... 372/21; 372/22
(58) Field of Classification Search ............ 372/21, 372/22, 34
See application file for complete search history.

(56) References Cited

U.S. PATENT DOCUMENTS 5,485,481 A    1/1996    Ventrudo et al.
5,691,989 A    11/1997    Rakuljic et al.

*Primary Examiner*—Armando Rodriguez
(74) *Attorney, Agent, or Firm*—Jordan and Hamburg LLP

(57) ABSTRACT

A compact apparatus is provided for stably converting a wavelength of a laser diode with the use of an optical fiber and a wavelength selective device. Employing a bulk type element as a wavelength selective device makes the action of controlling the temperature of the device easy, and can stabilize the wavelength emitted from the laser diode.

The optical fiber (2) is placed between the output side of a laser diode (1) and a wavelength selective device (5) of bulk type.

While the optical fiber (2) is arranged compact in the form of a coil, the length of an extra-cavity defined by the wavelength selective device (5) is sufficiently longer than the coherence length. Accordingly, the action of stably converting the wavelength can be carried out by the compact apparatus.

8 Claims, 2 Drawing Sheets

WAVELENGTH CONVERTER APPARATUS

FIELD OF THE INVENTION

The present invention relates to a wavelength converter apparatus and more particularly to a wavelength converter apparatus arranged with its wavelength selective device pulling wavelength in stability. Employing a optical fiber and bulk type element as a wavelength selective device makes the action of controlling the temperature of the device easy and can stabilize the wavelength emitted from the laser diode in its relatively smaller structural arrangement.

BACKGROUND OF THE INVENTION

In a wavelength converter apparatus provided with its wavelength converting device for changing the wavelength of a fundamental wave emitted from a laser diode, the wavelength of the fundamental wave has to be held in a permissible range determined by the wavelength converting device in order to produce its light output of a desired level. However, a change in the driving current of the laser diode caused by controlling the light output converted at constant level, may shift the oscillation wavelength of the laser diode with a change in the resonator length or in the gain spectrum creating a mode hopping phenomenon. The mode hopping phenomenon causes a momentary change in the light output, hence disallows the control system to carry out its action of maintaining the light output to a uniform level, whereby the light output will exhibit variations or noises.

In order to compensate the instability, a technique for locking the wavelength of a fundamental wave is known. As one of the familiar techniques, fiber Bragg grating having a Bragg diffraction grating formed in the core of optical fiber is provided to act as a wavelength selective device in an extra-cavity for carrying out the action of optical feedback to the laser diode and selecting the oscillation wavelength (See Patent Document 1).

Also, another technique is known where a reflection type volume holographic grating is provided to act as the wavelength selective device in an extra-cavity for carrying out the action of optical feedback to the laser diode and selecting the oscillation wavelength (See Patent Document 2).

Patent Document 1: U.S. Pat. No. 5,485,481.

Patent Document 2: U.S. Pat. No. 5,691,989.

In case that the fiber Bragg grating is employed as the wavelength selective device in one of the foregoing conventional techniques, its thermal characteristic is found that its Bragg reflection wavelength affects on the action of converting the wavelength and its temperature has to be held at a uniform degree. It is however difficult to maintain the temperature of the optical fiber at a uniform degree, which is comparatively troublesome to be handled. In addition, when the optical fiber is loaded with a physical stress for controlling the temperature, its light output may significantly be disturbed in the polarized state. In general, as the polarization of incident light received by the wavelength converting device remains fixed, its disturbed form may directly affect the light output.

Also, in the other conventional technique where a reflection type volume holographic grating is employed as the wavelength selective device, the resonator mode of the laser diode and the extra-cavity mode of the wavelength selective device will compete with each other unless the length of the optical path extending from the laser diode to the reflection type volume holographic grating is set significantly longer than the coherence length. Accordingly, the oscillation wavelength of the laser diode can hardly be pulled to the center wavelength of the reflection type volume holographic grating. In case that the optical path extending from the laser diode to the reflection type volume holographic grating is spatially increased, its setting will enlarge the overall arrangement of the apparatus.

It is hence an object of the present invention to provide a wavelength converter apparatus arranged with its wave selecting device pulling wavelengths in stability while requiring no action of strictly controlling the temperature of the device in a relatively smaller structural arrangement thereof.

SUMMARY OF THE INVENTION

As a first feature of the present invention, a wavelength converter apparatus is provided having a laser diode for producing a fundamental wave and a wavelength converting device for converting the wavelength of the fundamental wave and releasing its resultant output of light, and characterized by an optical fiber optically joined with the output side of the laser diode, and a wavelength selective device of bulk type placed in the output side of the optical fiber.

In particular, the wavelength selective device of bulk type is not a linear element such as a fiber grating but a bulk shape element such as a reflection type holographic grating, a reflection type diffraction grating, or a bandpass filter.

In the wavelength converter apparatus of the first feature, the optical fiber is employed as not a wavelength selective device and its temperature needs not to be controlled strictly. Also, the optical length (the length of an extra-cavity) between the laser diode and the bulk type wavelength selective device is set sufficiently longer than the coherence length because of the optical fiber. This allows the resonator mode of the laser diode and the extra-cavity mode not to compete with each other, hence minimizing a change in the oscillation wavelength of the laser diode. Also, since the wavelength selective device is of the bulk type, its temperature can be easily handled and precisely be controlled thus minimizing a variation in the center wavelength of the wavelength selective device which derives from variations of the ambient temperature. Accordingly, the action of the wavelength selective device for locking a wavelength can be stabilized. In addition, the optical fiber is arranged compact thus contributing to the downsizing of the entire apparatus.

As a second feature of the present invention, the wavelength converter apparatus of the first feature may be modified in which the wavelength selective device is a reflection type volume holographic grating.

In the wavelength converter apparatus of the second feature, the optical device of bulk type is implemented by a reflection type holographic grating which is an optical diffraction grating element and its temperature can be controlled with much ease.

As a third feature of the present invention, the wavelength converter apparatus may be modified in which the output of light of the optical fiber is focused by a lens to a focused beam at NA of 0.07 or higher and its beam waist is located in the interior of the wavelength selective device.

In the wavelength converter apparatus of the third feature, the focused beam at NA of not smaller than 0.07 is received by the wavelength selective device so that its beam waist (where the diameter of a spot of the beam is minimized) stays in the interior of the wavelength selective device. This will facilitate the positional adjustment of the wavelength selective device (permitting a lower level of the adjustment accuracy) as compared with the reception of a parallel beam.

As a fourth feature of the present invention, the wavelength converter apparatus may be modified in which the laser diode, the wavelength converting device, and the wavelength selective device can be controlled separately in the temperature.

In the wavelength converter apparatus of the fourth feature, the temperature of the laser diode, the temperature of the wavelength converting device, and the temperature of the wavelength selective device can independently be controlled thus to match the wavelength between the devices.

The wavelength converter apparatus according to the present invention eliminates the need of strictly controlling the temperature of the optical fiber. Also, the apparatus is implemented in a compact size where its wavelength selective device locks a desired wavelength in stability.

BEST MODES FOR EMBODYING THE INVENTION

The present invention will be described more precisely in conjunction with one preferred embodiment shown in the accompanying drawings. The present invention is however not limited to the embodiment.

Embodiment 1

Figure 1:
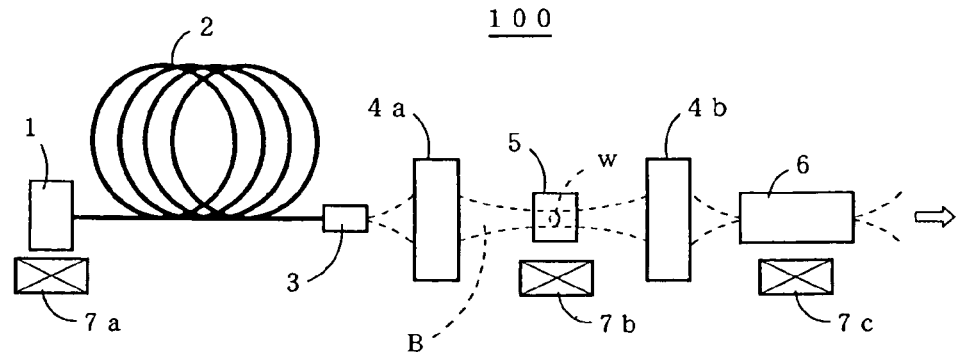
FIG. 1 is a structural explanatory view of a wavelength converter apparatus showing Embodiment 1 of the present invention.

FIG. 1 is an explanatory view showing a wavelength converter apparatus 100 of Embodiment 1.

The wavelength converter apparatus 100 comprises a laser_diode 1 for producing a fundamental wave (of, e.g., infrared ray), an optical fiber 2 optically joined with the output side of the semiconductor laser 1, a lens 4a for focusing the output of light from the optical fiber trailing end 3 to give a focused beam B, a bulk-type wavelength selective device 5 disposed so that the beam waist w of the converged beam B stays in the inside of the bulk-type wavelength selective device 5, a lens 4b for focusing the output of light from the wavelength selective device 5, a wavelength converting device 6 for receiving the light focused by the lens 4b and generating a wavelength converted light (for example, visible light), a thermo-module 7a for controlling the temperature of the semiconductor laser 1, a thermo-module 7b for controlling the temperature of the wavelength selective device 5, and a thermo-module 7c for controlling the temperature of the wavelength converting device 6.

The optical fiber 2 may be implemented by a coil, 3 cm at the diameter, of polarization maintaining, single mode optical fiber optic of 1 m long.

Preferably, the length of the optical fiber 2 is not shorter than 1 m for having the optical length, which extends from the output side of the laser diode 1 to the wavelength selective device 5, arranged sufficiently longer than the coherence length.

The lens 4a is provided for converting the light output of the optical fiber trailing end 3 into the focused beam B at NA of 0.07 or higher.

The wavelength selective device 5 reflects a portion of the light at the reflecting center wavelength of it, then the light is optically fed back via the optical fiber 2 to the semiconductor laser 1. This feedback permits the semiconductor laser 1 to oscillate at the proximity of the reflection center wavelength of the wavelength selective device 5.

The wavelength selective device 5 may be implemented by a reflection type volume holographic grating.

The wavelength converting device 6 may be a periodically poled nonlinear optical crystal.

The thermo-module 7a may be implemented by a Peltier device for controlling the temperature of the laser diode 1 to, for example, 25° C.

The thermo-module 7b may be implemented by a Peltier device for controlling the temperature of the wavelength selective device 5 to, for example, 25° C.

The thermo-module 7c may be implemented by a Peltier device for controlling the temperature of the wavelength converting device 6 to a degree which allows the light at a wavelength selected by the wavelength selective device 5 to be converted at the optimum efficiency.

Figure 2:
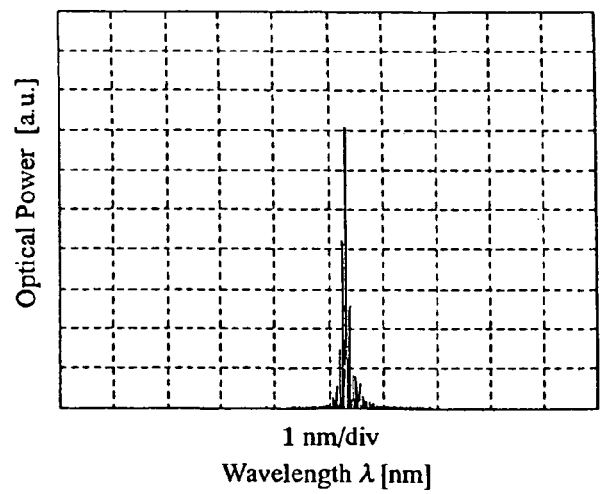
FIG. 2 is a characteristic diagram showing an oscillation spectrum of a laser diode in the wavelength converter apparatus of Embodiment 1.

FIG. 2 illustrates an oscillation spectrum of the laser diode 1.

Since the length of the extra-cavity is sufficiently longer than the coherence length, the locked spectrum remains stable.

Figure 3:
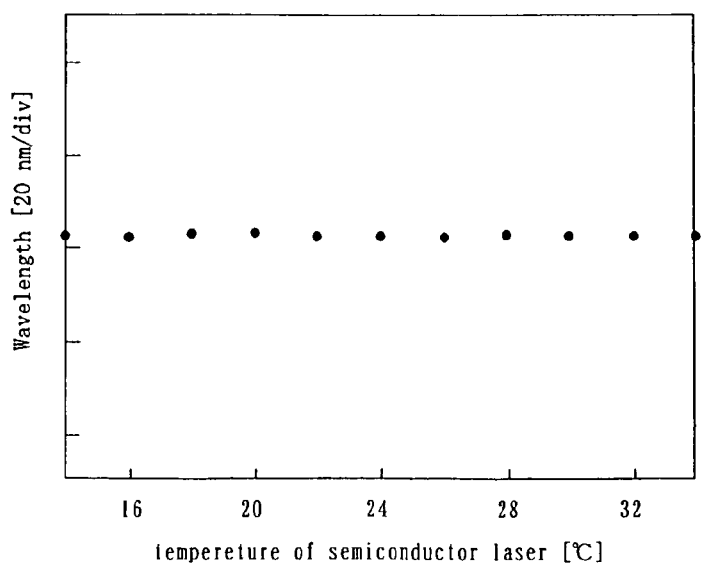
FIG. 3 is a characteristic diagram showing the dependence of the center wavelength on temperature of the laser diode in the wavelength converter apparatus of Embodiment 1.

FIG. 3 illustrates a profile of the oscillation center wavelength of the laser diode 1 when its temperature is varied. The vertical axis represents 2 nm/div.

When the temperature is varied from 14° C. to 34° C., the oscillation center wavelength of the laser diode 1 remains stable.

Figure 4:
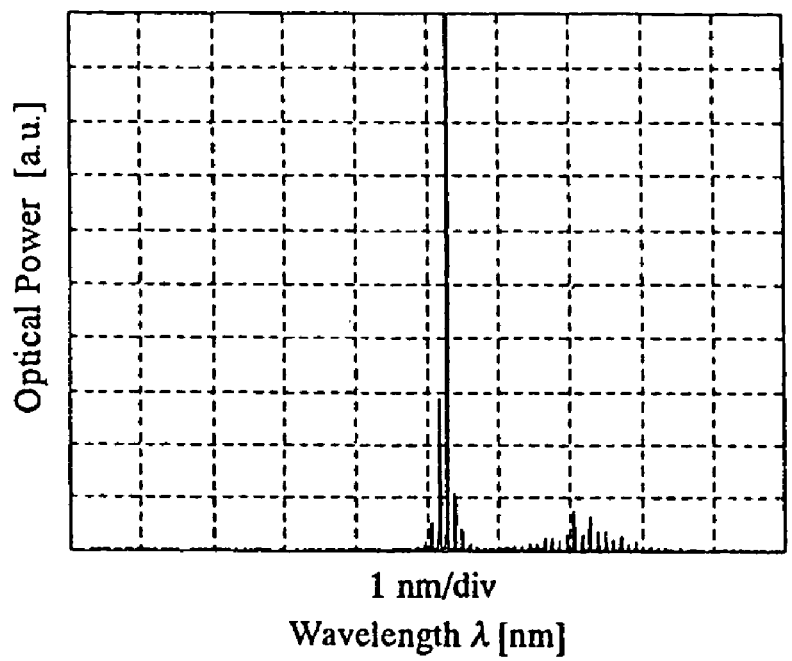
FIG. 4 is a characteristic diagram showing an oscillation spectrum of a laser diode in a comparative laser apparatus where the instability of locking the wavelength is seen because of the mode competition between cavity mode of laser diode and extra-cavity mode.

FIG. 4 shows a comparison of the oscillation spectrum of the laser diode 1 when the length of the extra-cavity is not sufficiently longer than the coherence length.

As seen in FIG. 4, the cavity mode of the laser diode 1 and the extra-cavity mode of the wavelength selective device 5 compete with each other.

Figure 5:
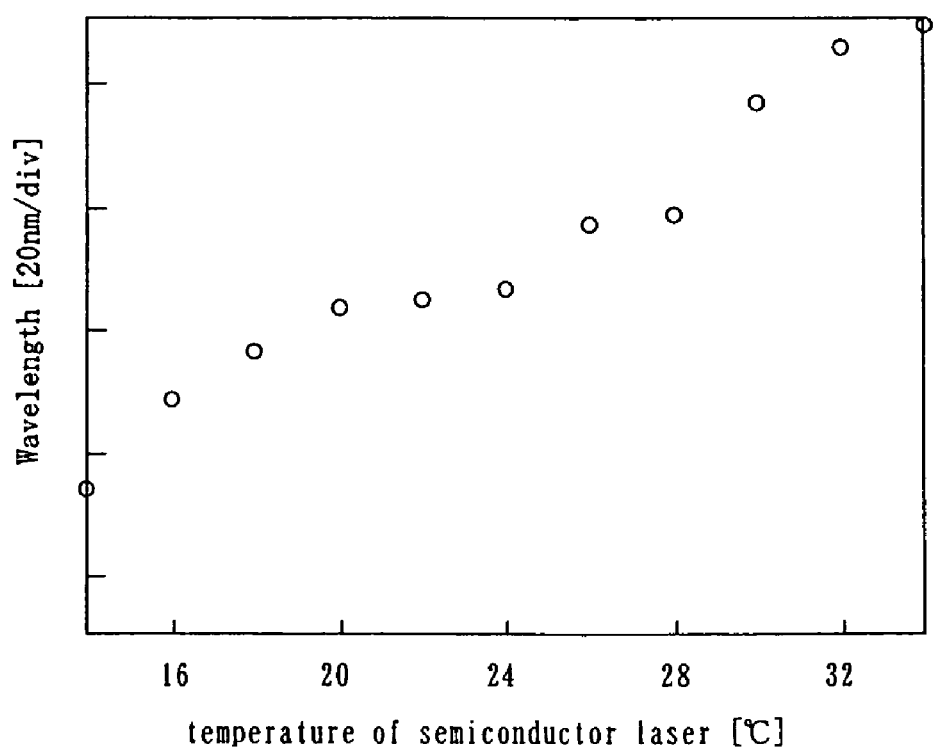
FIG. 5 is a characteristic diagram showing the dependence of center wavelength on temperature of the laser diode without employing the wavelength selective device.

FIG. 5 shows a comparison of the oscillation center wavelength of the laser diode 1 when the temperature of the semiconductor laser 1 is varied with no presence of the wavelength selective device 5. The vertical axis represents 2 nm/div.

As seen in FIG. 5, the laser diode 1 changes the center wavelength of its oscillation when its temperature is varied.

The advantages of the wavelength converter apparatus 100 of Embodiment 1 are as follows.

(1) Since the wavelength selective device 5 employs a bulk type device, its temperature can be controlled much easier and exactly, so that the variation of the wavelength emitted from the laser diode will be suppressed despite the variation of ambient temperature.

(2) Since the optical fiber 2 is provided compact in the form of a coil, it allows the extra-cavity length to be sufficiently longer than the coherence length even in a smaller space, thus giving no competition between the cavity mode of the laser diode 1 and the extra-cavity mode and ensuring the stable action of the wavelength selective device 5 for locking the wavelength with the use of a smaller structure.

(3) Since the wavelength selective device 5 employs a bulk type device, its temperature can be controlled with ease and certainty, thus minimizing a change in the wavelength of the fundamental wave derived from variations of the ambient temperature.

(4) Since the wavelength selective device 5 is located in the proximity of the beam waist w of the focused beam B, its angular adjustment can be facilitated for promoting the optical feedback.

INDUSTRIAL APPLICABILITY

The wavelength converter apparatus according to the present invention is favorably applicable to the field of analytical and measuring instruments or bioengineering.

What is claimed is:

1. A wavelength converter apparatus having a laser diode for producing a fundamental wave and a wavelength converting device for converting the wavelength of the fundamental wave and generating its resultant output of light, characterized by:

an optical fiber optically joined with the output side of the laser diode; and a wavelength selective device of bulk type placed in the output side of the optical fiber.

2. A wavelength tunable converter according to claim 1, wherein the wavelength selective device is a reflection type volume holographic grating.

3. A wavelength converter apparatus according to claim 1, wherein the output of light of the optical fiber is focused by a lens to be at NA of 0.07 or higher and its beam waist is located in the interior of the wavelength selective device.

4. A wavelength converter apparatus according to claim 2, wherein the output of light of the optical fiber is focused by a lens to be at NA of 0.07 or higher and its beam waist is located in the interior of the wavelength selective device.

5. A wavelength converter apparatus according to claim 1, wherein

The temperature of the laser diode, the wavelength converting device, and the wavelength selective device can be controlled separately.

6. A wavelength converter apparatus according to claim 2, wherein

The temperature of the laser diode, the wavelength converting device, and the wavelength selective device can be controlled separately.

7. A wavelength converter apparatus according to claim 3, wherein

The temperature of the laser diode, the wavelength converting device, and the wavelength selective device can be controlled separately.

8. A wavelength converter apparatus according to claim 4, wherein

The temperature of the laser diode, the wavelength converting device, and the wavelength selective device can be controlled separately.

* * * * *